United States Patent [19]

Allen et al.

[11] Patent Number: 4,626,706

[45] Date of Patent: Dec. 2, 1986

[54] DIGITAL SIGNAL LEVEL TRANSLATION/MASTER-SLAVE FLIP FLOP WITH LOOK-AHEAD

[75] Inventors: Michael Allen, San Francisco; Tsen-Shau Yang, San Jose, both of Calif.

[73] Assignee: Advanced Micro Devices, Inc., Sunnyvale, Calif.

[21] Appl. No.: 614,403

[22] Filed: May 24, 1984

[51] Int. Cl.[4] .............................................. H03K 3/289

[52] U.S. Cl. ................................ 307/272 A; 307/475; 307/443; 307/291; 307/455

[58] Field of Search ................... 307/264, 272 A, 289, 307/291, 475, 443, 455; 377/115–117

[56] References Cited

U.S. PATENT DOCUMENTS 3,430,070 2/1969 Marshall et al. .................... 307/272

FOREIGN PATENT DOCUMENTS 0117427 9/1981 Japan .................................. 307/475

*Primary Examiner*—John S. Heyman
*Assistant Examiner*—M. R. Wambach
*Attorney, Agent, or Firm*—Patrick T. King; Mark A. Haynes; J. Vincent Tortolano

[57] ABSTRACT

Disclosed is a digital signal translation circuit for translating a first type signal to a second type signal which comprises a master latch and a slave latch. The master latch latches the incoming first type signal during a first portion of the clock signal. A slave latch latches the master latch output and generates a differential output. The differential output of the slave drives an output driver circuit which generates the second type signal.

16 Claims, 3 Drawing Figures

DIGITAL SIGNAL LEVEL TRANSLATION/MASTER-SLAVE FLIP FLOP WITH LOOK-AHEAD

FIELD OF THE INVENTION

The present invention relates to digital signal translation circuits for use in translating a digital signal from a level operable in one type of circuit, such as TTL, to a level operable to run another type of circuit, such as ECL.

DISCUSSION OF BACKGROUND AND PRIOR ART

There are various types of logic circuit technologies in conventional use. Two of the most common types are TTL and ECL. Designers choose among the various types of circuits based upon the availability of devices already designed, the desired speed of the circuit, the power consumption limitations of the circuit and other well known factors.

Often it is desirable to use more than one type of logic circuit technology in a given digital circuit. For instance, a designer may use a TTL data storage device in a circuit comprised of ECL logic. The digital signal produced by the TTL device may switch five volts from high to low while the ECL logic circuit operates with a voltage swing of a few hundred millivolts. Thus there is a need for circuitry translating the signal from the TTL device to a level compatible with the ECL logic.

Conventionally in the above TTL to ECL example, the translation is accomplished by using a specially adapted ECL translation circuit which receives the TTL signal and produces an ECL output. The TTL signal is received by a TTL register from which the prior art translation circuit detects the level of the TTL signal, then generates an ECL output. Thus a delay is caused by waiting for the data to latch in the TTL register before the translation circuit can begin generating the ECL output.

The prior art ECL translation circuit further requires supply voltage levels different from the TTL circuitry with which it is associated, such as the base reference voltage for the ECL current switching transistors. Accordingly, the prior art ECL translation circuit is complicated to implement. Also, because of the large voltage difference between TTL and ECL circuits, complicated circuitry such as clamping diodes on the base of the ECL current switching transistors are necessary to prevent overdriving the translation circuit.

Accordingly, there is a need for digital signal translation circuit which is faster and less complicated than prior art translators.

SUMMARY OF THE INVENTION

In accordance with the foregoing, the present invention provides an apparatus for translating a first type signal to a second type signal, such as a TTL signal to an ECL signal, which is faster and less complicated than prior art techniques for translating digital signals.

The apparatus includes a master latch means which latches the first type signal during a portion of a clock cycle and generates a master latch signal which indicates the level of the first type signal. A slave latch means latches the master latch signal and generates a slave latch signal. The slave latch means includes a lookahead means which in response to the master latch signal causes the slave latch signal to switch prior to the completion of the latch of the master latch signal by the slave latch means. Further, an output driver means responsive to the slave latch signal supplies an output of a second type signal.

In the preferred embodiment, the slave latch signal is a differential signal which drives a differential pair of current switching transistors. In this manner, the output driver means generates the second type signal very quickly in response to a change in the master latch signal through the lookahead means. Furthermore, the output driver means responsive to the differential signal can be designed simply without requiring additional reference voltage levels to be supplied to the circuit.

Thus the present invention provides an apparatus for translating a first type signal to a second type signal which is faster and less complicated than prior art devices.

DESCRIPTION OF THE PREFERRED EMBODIMENT

With reference to the drawings, a detailed description of the preferred embodiment is provided. First, a simplified description is provided referring to FIG. 1. Then, the detailed circuit disclosed in FIG. 2 is described showing one preferred embodiment, with reference to the timing diagram in FIG. 3.

Figure 1:
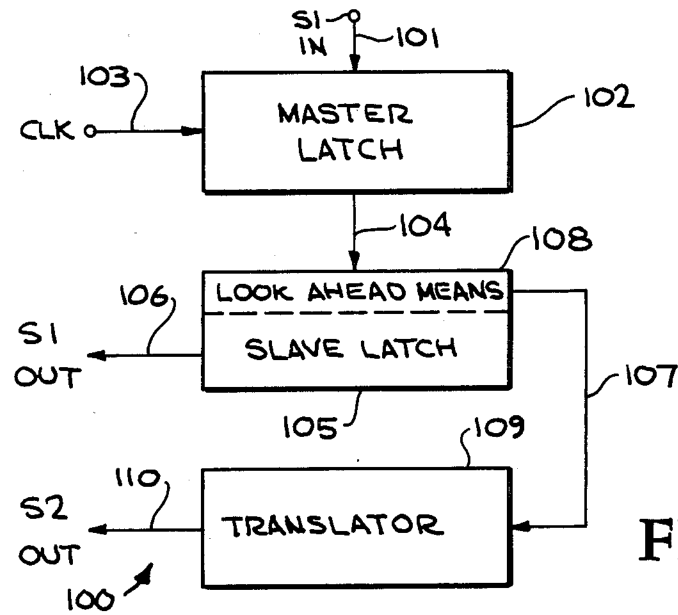
FIG. 1 is a simplified block diagram of one embodiment of the present invention.

FIG. 1 shows a simplified block diagram of an apparatus 100 embodying the present invention. A first type signal S1 is provided at an input 101 to a master latch means 102 for latching the first type signal S1. The master latch means 102 receives a clock signal 103. During a portion of the clock signal 103 such as the low voltage portion, the master latch means 102 latches the first type signal S1 and produces a master latch signal over line 104. A slave latch means 105 receives the master latch signal over line 104 and upon completion of the latch of master latch signal 104 in the slave latch means 105 the first type signal S1 is stored for output at the line 106 from the slave latch means 105. Also the slave latch means 105 generates a slave latch signal over line 107 in response to the master latch signal 104. A lookahead means 108 included in the slave latch means 105 causes the slave latch signal on line 107 to track the changes in the master latch signal 104 before the slave latch means 105 completes the latch of the master latch signal 104. The slave latch signal on line 107 drives a translator means 109 for generating a second type signal S2 at output line 110.

Accordingly, the apparatus 100 of the present invention provides a translation technique which overcomes the delay required by prior art translation techniques in which the translated output is generated after the input signal (corresponding to S1) is latched by a register. The specific embodiment of the apparatus 100 shown in FIG. 2 illustrates further advantages of the present invention.

Figure 2:
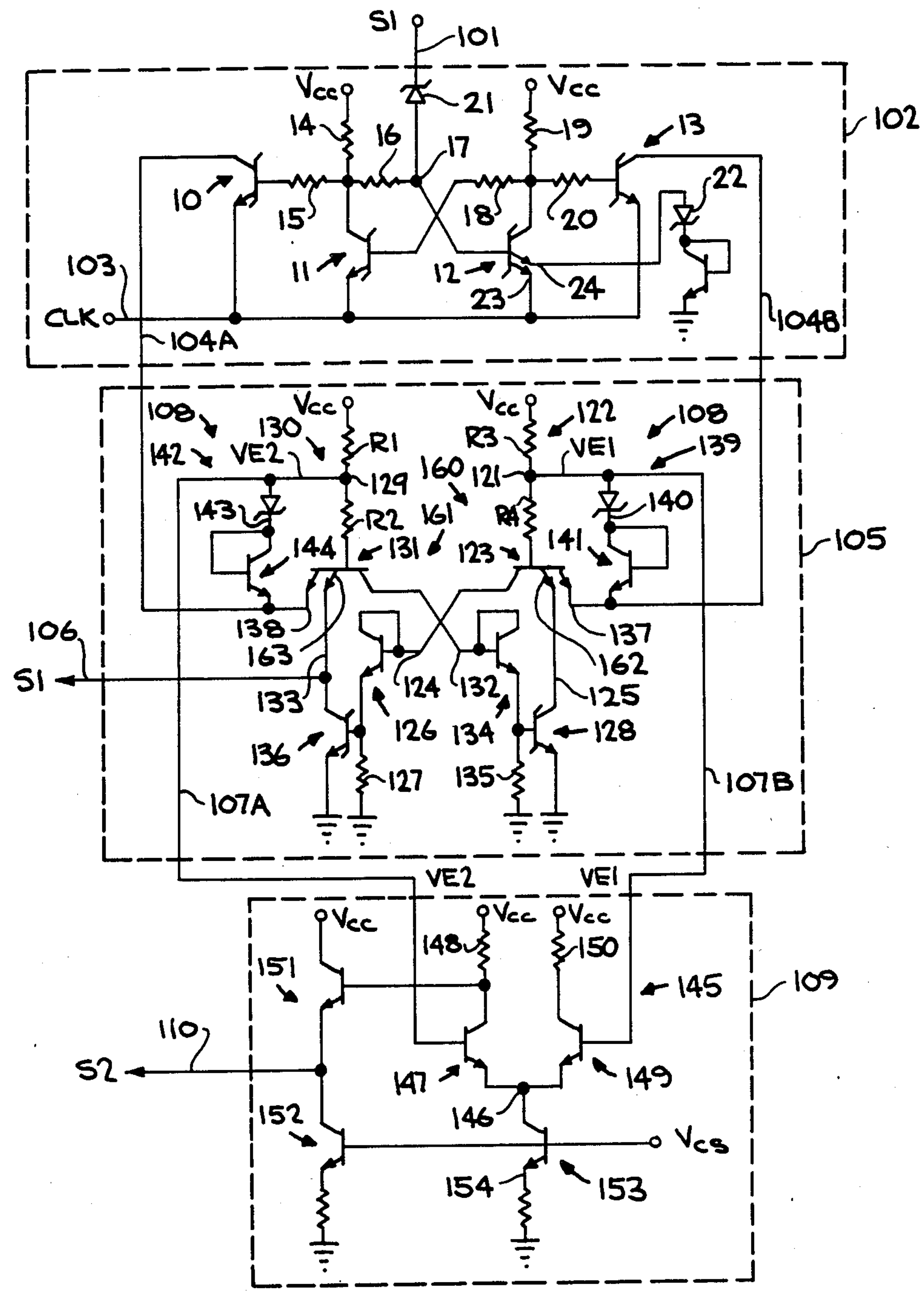
FIG. 2 is a circuit diagram illustrating the preferred embodiment of the present invention.

FIG. 2 shows a circuit diagram of the apparatus 100 according to the present invention which translates a TTL type digital signal to an ECL type digital signal. The TTL signal, designated S1 for consistency in this disclosure, is input to the master latch means 102 at the line 101. The master latch signal 104A, 104B generated by the master latch means 102 drives the slave latch means 105. The slave latch means 105 generates a differential signal on lines 107A, 107B, which drives the output driver means 109 (corresponding to the translator means 109 of FIG. 1). The output driver means 109 generates the second type signal S2 at the output line 110 in response to the differential signal on lines 107A, 107B . In this example, the second type signal S2 is an ECL type output on the line 110.

The master latch means 102 includes the components as illustrated using conventional symbols in FIG. 2. A clock signal is provided over line 103 to the emitter of four transistors 10, 11, 12 and 13. The collector of transistor 11 is connected through resistor 14 to reference voltage $V_{CC}$. Across resistor 15, the collector of transistor 11 is connected to the base of transistor 10. The collector of transistor 11 is also connected across resistor 16 to the node 17. The input signal S1 is supplied across line 101 to the node 17. Also the base of the transistor 12 is connected to the node 17. The base of transistor 11 is connected across resistor 18 to the collector of transistor 12. The collector of transistor 12 is connected across resistor 19 to the reference voltage $V_{CC}$ and across resistor 20 to the base of transistor 13. A Schottky diode 21 is provided on the input for S1 to limit current flow into the master latch means 102 when S1 is high. Further, a diode string 22 is provided for setting up the latch. In the embodiment shown, the transistor 12 has two emitters 23, 24; the second emitter 24 connects to one end of the diode string 22 which is connected to ground at the other end, while the first emitter 23 connects to the clock 103. The diode string 22 assures that the voltage at the base of transistors 11 and 12 will set up according to the signal S1 during clock high for latching when the clock swings low, as is appreciated in the art.

The diode string 22 comprises two diodes connected in series, the later of which is an NPN transistor with its collector and base terminals connected together. This connection of the base and collector terminals of the transistor providing an equivalent diode circuit is well known in the art. The emitter terminal 24 of the transistor 12 is clamped to a voltage reference not to exceed two PN junction voltage drops of the diode string 22 as a means to assure that the voltage at the base of transistors 11 and 12 will set up according to the signal S1 when the clock signal on line 103 is high for latching the master latch 102 when the clock signal on line 103 swings low.

This latching of the master latch 102 is appreciated and more clearly understood by way of example. In a first example, it is assumed that the clock signal on line 103 is high and the signal S1 on line 101 is also high. In such a condition, the node 17 is high providing current into the base of transistor 12 through the emitter terminal 24 into the diode string 22. Thus, transistor 12 is on. With transistor 12 on, transistor 11 is off by virtue of the cross connections collector and base terminals of transistors 11 and 12. More specifically, when transistor 12 is on, the collector voltage of transistor 12 is low, which collector voltage is presented to the base of transistor 11 through resistor 18. With a low voltage at the base of transistor 11, and with a high voltage on the clock line 103, transistor 11 is off. As the voltage on the clock line 103 swings from a high to low voltage state, transistor 12 remains on and transistor 11 remains off, thereby latching the master latch 102 to a high state corresponding to the input signal S1 on line 101.

By way of further example, it is assumed that the clock signal on line 103 is high and the input signal S1 on line 101 is low. With a low input signal on line 101, node 17 is low. By virtue of diode 21, when node 17 is low, transistor 12 is off while transistor 11 is on. As the voltage on clock line 101 swings from a high to low state, transistor 12 remains off by virtue of a low node voltage on node 17, and transistor 11 remains on. Hence, the diode string 22 is used for set-up to latch the master latch 102 in a high or one state with a high input signal S1 on line 101, whereas diode 21 assures a proper latching to a low state when the input signal S1 on line 101 is low.

The master latch signal on lines 104A, 104B is generated at the collectors of the transistors 10 and 13 respectively.

When the clock signal on line 103 is high, none of the transistors 10, 11, or 13 will be conducting and the first emitter 23 of transistor 12 will be non-conducting. When the clock signal swings low, if S1 was low in the previous clock high period, then the collector of transistor 13 will be pulled low while transistor 10 will be turned off. Conversely, if S1 is high during the previous high portion of the clock cycle, then the collector of transistor 10 will be pulled low when the clock swings low while transistor 13 will be turned off. Accordingly, when the output of the collect of transistor 13 swings low, the master latch signal on line 104B is termed a low master latch signal corresponding to a low level in the first type signal S1. Likewise, when the output or the collector of transistor 10 swings low, the master latch signal on line 104A is termed the high master latch signal corresponding to a high level in the first type signal S1.

The slave latch means 105 includes a first semiconductor switch 160 and a second semiconductor switch 161 connected in a latch relationship. The slave latch means 105 produces differential output signals VE1, VE2 over lines 107B, 107A respectively. The voltage VE1 is taken at the node 121 of voltage divider means 122 which is connected from the reference voltage $V_{CC}$ to the base of dual emitter transistor 123 of the first semiconductor switch 160. The dual emitter transistor 123 latches the low master latch signal across line 104B. At the dual emitter transistor 123, the first semiconductor switch 160 divides into a first circuit path 124 and a second circuit path 125. The first circuit path 124 is connected from the collector of the dual emitter transistor 123 through a diode means, such as the transistor 126 connected with its base and collector at a common node, through resistor 127 to ground. The second circuit path 125 is connected from the first emitter 162 of dual emitter transistor 123 to the collector of transistor 128. The emitter of transistor 128 is connected to ground.

The voltage VE2 is taken from the node 129 of voltage divider means 130 which is connected from the base of dual emitter transistor 131 of the second semiconductor switch 161 to the reference voltage $V_{CC}$. The dual emitter transistor 131 drives a first circuit path 132 and a second circuit path 133. The first circuit path 132 is connected from the collector of the dual emitter transistor 131 through a diode means, such as transistor 134 connected with its base and collector at a common node, through a resistor 135 connected to ground. The second circuit path 133 is connected from the first emitter 163 of the dual emitter transistor 131 to the collector of the transistor 136. The emitter of transistor 136 is connected to ground.

The first circuit path 124 of the first semiconductor switch 160 is connected at the emitter of the transistor 126 to the base of the transistor 136 in the second circuit path 133 of the second semiconductor switch 161. Likewise the first circuit path 132 of the second semiconductor switch 161 is connected at the emitter of transistor 134 to the base of transistor 128 in the second circuit path 125 of the first transistor switch 160.

The low master latch signal on line 104B is connected to the slave latch means 105 at the second emitter 137 of the dual emitter transistor 123. Likewise the high master latch signal 104A is connected at the second emitter 138 of the dual emitter transistor 131.

The lookahead means 108 comprises a diode means 139 coupled across node 121 providing the voltage signal VE1 and the low master latch signal line 104B at the second emitter 137 of the dual emitter transistor 123. The diode means 139 in the preferred embodiment includes the Schottky diode 140 and the transistor 141 connected with its base and collector at a common node.

Likewise a diode means 142 is coupled across the voltage signal VE2 at the node 129 and the high master latch signal 104A at the second emitter 138 of the dual emitter transistor 131. The diode means 142 in the preferred embodiment includes the Schottky diode 143 and the transistor 144 with its collector and base connected at a common node as shown in the Figure. The diode means 142 likewise provides a lookahead means 108 as described below.

The slave latch means 105 can be defined as having a first state when VE1 is at a higher voltage level than voltage signal VE2, and having a second state when the voltage signal VE2 is at a higher level than the voltage signal VE1.

Assuming that the slave latch means 105 is in the first state, with VE1 high and VE2 low, the dual emitter transistor 123 will be off so that the second circuit path 125 of the first semiconductor switch 160 will be nonconducting with transistor 128 turned off. Also the first circuit path 124 of the first semiconductor switch 160 will be energized with transistor 136 on and transistor 126 conducting. Meanwhile the dual emitter transistor 131 and the first circuit path 132 and second circuit path 133 of the second semiconductor switch 161 will be in the opposite states.

It should be appreciated that the slave. latch means 105 is stabilized by the inclusion of the transistors 126, 134, or other diode means, in the slave latch means 105. That is the state of the slave latch means 105 is less likely to change due to transients or other random signals, because with the transistors 136 and 126 on and the transistor 134 and 128 off, as explained in our example with the slave latch means 105 in the first state, the voltage of $2V_{SAT}$ holds off 2 $V_{BE}$ at the collector of the dual emitter transistor 131. A more conventional slave latch would have only $V_{SAT}$ holding off $V_{BE}$. Thus many random perturbations which may occur in the system are eliminated in the preferred embodiment.

In operation, as the clock signal on line 103 goes high, transistors 10, 11 and 13 turn off, thus preventing conduction of current on line 104. The slave latch 105 maintains a latch condition determined by when the clock signal on line 103 previously went low. As the clock signal on line 103 switches from a high state to a low state, transistors 10 and 13 assume one of two states wherein either transistor 10 or transistor 13 is on but not both. As the clock signal on line 103 goes low, causing either of transistor 10 or 13 to conduct, a low signal is presented on either line 104A or 104B. The slave latch 105 will then assume a state consistent with the state of the master latch 102. As the clock signal on line 103 goes low, conduction occurs on either line 107A or 107B by virtue of conduction through either diode 143 and transistor 144, or diode 140 and transistor 141, respectively. Hence, as the clock signal on line 103 goes low, the corresponding signal, that is a look-ahead signal, is immediately provided on lines 107A and 107B to the output driver means 109 which then assumes the state to which the slave latch 105 will latch.

The output driver means 109 receives a signal on lines 107 indicative of the state of the master latch 102 upon an immediate low swing of the clock signal on line 103. The output driver receives signals upon the changing of the clock signal 103 without having to wait for the slave latch 105 to assume its proper state. Hence, the output driver looks ahead, that is, looks to the present state of the master latch 102 by virtue of differential signals on lines 107, and immediately presents a corresponding output S2 on line 110. The look-ahead means is the communication path of diode 143 and transistor 144 or diode 140 and transistor 141, communication the differential outputs of the master slave latch 102 directly to the output driver 109.

The voltage signals VE1, VE2 provide a differential signal on lines 107A, 107B to the output driver means 109. The output driver means 109 comprises a differential pair 145 of transistors connected to a common emitter node 146.

The first transistor 147 of differential pair 145 is connected with its emitter at the common emitter node 146. The collector of the first transistor 147 is connected through resistor 148 to the reference voltage $V_{CC}$. The base of the first transistor 147 is connected to the line 107A and thus receives signal VE2. The second transistor 149 of the differential pair 145 of transistors is connected with its emitter at the common emitter node 146 and its collector connected through resistor 150 to the reference voltage $V_{CC}$. The base of the second transistor 149 is connected to the line 107B, and thus receives the voltage signal VE1.

The collector of the first transistor 147 of the differential pair 145 is connected to an emitter follower output driver circuit 151 as shown. The ECL type digital signal S2 is provided over the line 110 from the emitter follower output driver circuit 151.

In the preferred embodiment a constant current source 152 is connected to the emitter follower output driver circuit 151 as shown in FIG. 2. Likewise a constant current source 153 such as the constant current source transistor 154 is connected from the common emitter node 146 to ground. Thus in the preferred embodiment, the voltage divider means 130 and 122 are tuned so that the static level of the differential voltage across lines 107A, 107B is maintained high enough to prevent saturation of the constant current source transistor 154. That is, the static level of the differential voltage is kept sufficiently above the current source supply voltage $V_{CS}$ to prevent saturation of the transistor 154.

Figure 3:
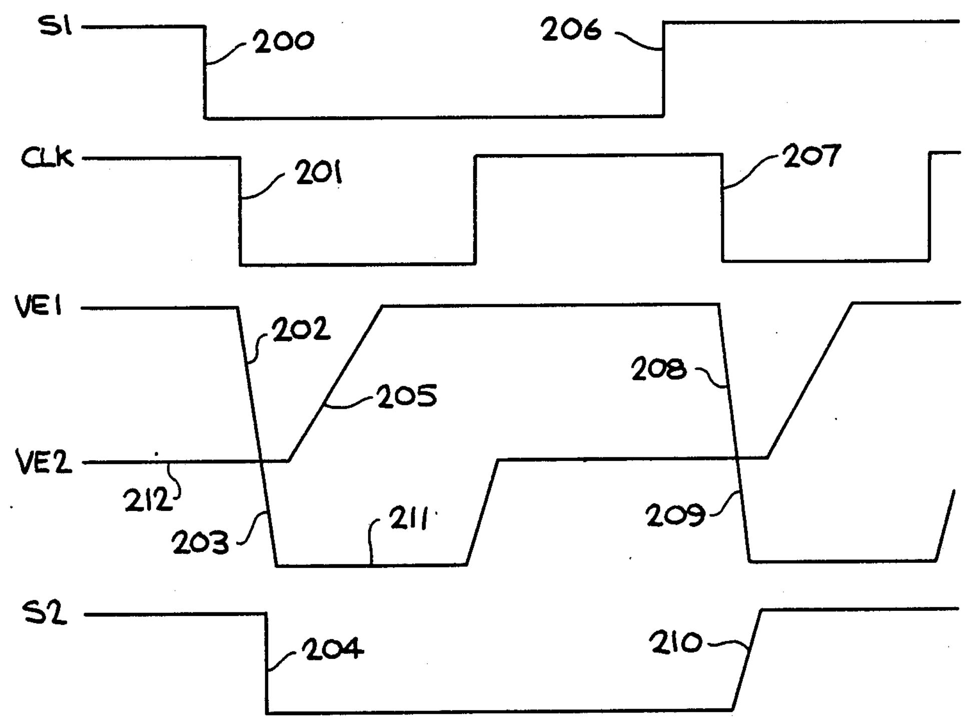
FIG. 3 is a timing diagram used in conjunction with FIG. 2 for explanation of the invention.

FIG. 3 is a timing diagram which will illustrate the operation of the preferred embodiment of the present invention as shown in FIG. 2. Assume as shown in the Figure, that S1 is high, the clock CLK is high, the slave latch means 105 is in a first state where VE1 is high and VE2 is low, and accordingly S2 is high. If S1 falls low at point 200 before the clock falls low, then the output on the low master latch signal on line 104B will be pulled low when the clock falls at point 201. The lookahead means 108 through the diode means 139 will cause VE1 to be pulled low at point 202 as the low master latch signal on line 104B swings low. When VE1 swings below VE2 at point 203, then the differential pair 145 of transistors will switch causing the output S2 at line 110 to swing low at point 204. Note that this switching of the differential pair 145 occurs before the slave latch means 105 has completed its latch of the master latch signal at point 205. It will be noted that when VE1 swings low, the dual emitter transistor 123 will turn on causing the transistors 136, 126 to turn off. When this occurs the transistors 134, 128 will turn on to latch the low master latch signal 104B. At that point, VE2 will swing high as shown on the timing diagram at point 205.

It can be seen from the FIG. 3 that the low state of VE1 during clock low at point 211 is lower than the low state of VE2 during clock high at point 212. For the low states of VE1 with clock low:

$$VE1=(V_{OL,clock}+V_{SAT,13}+V_{BE,141}+V_{SH,140}) \quad (1)$$

and low state of VE2 with clock high:

$$VE2 = V_{CC} - \frac{R1}{R1+R2}(V_{CC} - V_{BE,131} - V_{SAT,136}) \quad (2)$$

where $V_{OL,clock}$=low clock voltage level, $V_{SAT,13}$=saturation voltage for transistor 13, $V_{BE,141}$=base-emitter voltage of transistor 141, $V_{SH,140}$=Schottky voltage of diode 140, $V_{CC}$=reference voltage, $\frac{R1}{R1+R2}$ = voltage divider constant for voltage divider means 130, $V_{BE,131}$=base-emitter voltage of transistor 131, and $V_{SAT,136}$=saturation voltage of transistor 136.

By proper setting of the voltage divider constant and $V_{OL,clock}$, VE1 for low clock in its low state is lower than VE2 in its low state for high clock. In this manner, the differential signal 107A, 107B switches state at point 203 before VE2 changes from low to high at point 205 upon completion of the latch.

When the clock signal swings high, VE1 will track the clock signal but will not reach the level of VE2.

If the first type signal S1 swings high at point 206 before the clock signal swings low at point 207 in a succeeding cycle as shown in the Figure, then upon the low clock signal, the high master latch signal on line 104A will be pulled low causing VE2 to swing low at point 208 as shown in the timing diagram. When VE2 swings below VE1 at point 209, the differential pair 145 of transistors in the output driver means 109 will switch causing the output S2 to swing high at point 210.

It will be appreciated that the difference between VE1 and VE2 determines the switching of the differential pair 145 providing the output at the line 110 creating the ECL type signal S2. For our example translating a TTL signal S1 to an ECL output S2, the present circuit is well suited as shown below. Assuming that the transistor 136 is on while the slave latch means 105 is in its first state as explained above, then during clock high:

$$VE1 = V_{CC} - \frac{R1}{R1+R2}(V_{CC} - V_{BE,136} - V_{BE,126} - V_{SH,123}) \quad (3)$$

$$VE2 = V_{CC} - \frac{R1}{R1+R2}(V_{CC} - V_{BE,131} - V_{SAT,136}) \quad (4)$$

Where:

$V_{CC}$=the reference voltage, $\frac{R1}{R1+R2}$ = voltage divider constant for voltage divider means 122 and 130, $V_{BE,131}$=base-emitter voltage of dual emitter transistor 131, $V_{SAT,136}$=saturation voltage of transistor 136, $V_{BE,136}$=base-emitter voltage of transistor 136, $V_{BE,124}$=base-emitter voltage of transistor 124, and $V_{SH,123}$=Schottky voltage of dual emitter transistor 123.

Since transistors with similar characteristics are used in the preferred embodiment, $V_{BE}$, $V_{SAT}$ and $V_{SH}$ for all of the transistors are essentially common values and $V_{SAT}$ is about equal to $V_{BE}$ minus $V_{SH}$.

The difference between VE1 and VE2, delta VE is then:

$$\text{delta } VE = \frac{R1}{R1+R2}2(V_{SH}) = VE1 - VE2 \quad (5)$$

With the voltage divider constant for both voltage divider means 122, 130 equal to ½, delta VE will be in the range of about 400 to 600 millivolts, depending on temperature. It should be appreciated that this delta VE provides a suitable swing for the output driver circuit producing the ECL type signal S2.

The circuit of the preferred embodiment as shown in FIG. 2 is formed on a single semiconductor chip which includes a TTL register with a fast ECL output. This is efficiently accomplished according to the present invention because the need of the base reference voltage in the ECL type output driver circuit is eliminated. The TTL register with the fast ECL output stores the TTL signal for output at line 106 to other TTL portions of the logic circuit employing the invention while producing the ECL type output at line 110 to ECL portions of the logic circuit at essentially the same time as the TTL output.

Throughout this disclosure, the circuits have been described as operating with supply voltages between a reference voltage $V_{CC}$ and ground. It should be understood that the supply voltages used in the circuit can be selected as suits the user and need not use a ground potential or any particular voltage potential to provide the supply voltages.

Further aspects and advantages of the present invention can be seen by a study of the specification, the drawings and the claims appended hereto. The foregoing description of a preferred embodiment of the invention has been presented for purposes of illustration and description. It is not intended to be exhaustive or to limit the invention to the precise form disclosed, and obviously many modifications and variations are possible in light of the above teaching. The TTL to ECL embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An apparatus for translating a first type signal to a second type signal, the apparatus being responsive to a clock signal, comprising:

(a) master latch means for receiving and latching the first type signal during a portion of the clock signal and for generating a master latch signal corresponding to the level of the first type signal;

(b) slave latch means for receiving and latching the master latch signal and for generating a slave latch signal;

(c) lookahead means, receiving and responding to the master latch signal, for switching the slave latch signal to a state corresponding to the state of the master latch signal before said slave latch means completes a latch of the master latch signal; and (d) output driver means, receiving and responding to the slave latch signal, for supplying the second type signal.

2. The apparatus of claim 1, wherein:

said slave latch signal is a differential slave latch signal, the differential slave latch signal including a first voltage signal and a second voltage signal and having a first state when the first voltage signal is higher than the second voltage signal and having a second state when the second voltage signal is higher than the first voltage signal, and said output driver means includes a pair of coupled transistors, one of said pair of coupled transistors receiving said first voltage signal and being turned on when the differential slave latch signal is in the first state and the other of said pair of coupled transistors receiving said second voltage signal and being turned on when the differential slave latch signal is in the second state.

3. The apparatus of claim 2, including:

biasing means for biasing to a minimum level said first and second voltage signals of said differential slave latch signal.

4. An apparatus for translating a first type digital to a corresponding second type digital signal, the apparatus being responsive to a clock signal, comprising;

(a) master latch means for receiving and latching the first type digital signal durlng a portion of the clock signal and for generating a master latch signal corresponding to the level of the first type digital signal;

(b) slave latch means, for receiving and latching said master latch signal and for generating a differential slave latch signal, the differential slave latch signal including a first voltage signal and a second voltage signal and having a first state when the first voltage signal is higher than the second voltage signal and having a second state when the second voltage signal is higher than the first voltage signal, the state of the differential slave latch signal corresponding to the first type digital signal;

(c) lookahead means, receiving and responding to the master latch signal, for switching the state of the differential slave latch signal before said slave latch means completes a latch of the master latch signal; and (d) output driver means receiving and responding to the differential slave latch signal, for supplying the second type digital signal.

5. The apparatus of claim 4, wherein said output driver means includes:

a pair of coupled transistors, one of said pair of coupled transistors respectively receiving said first voltage signal of said differential slave latch signal and being turned on when the differential slave latch signal is in the first state and the other of said pair of coupled transistors respectively receiving said second voltage signal of said differential slave latch signal and being turned on when the differential slave latch signal is in the second state, and a constant current source supplying bias current through said pair of coupled transistors.

6. The apparatus of claim 4, wherein:

said pair of coupled transistor are bipolar devices having emitters connected to a common emitter node, and said constant current source supplying said bias current thorugh said common emitter node.

7. The apparatus of claim 4, including:

a first voltage divider means coupled to said slave latch means for receiving said first voltage signal and for biasing said first voltage signal to a minimum level; and a second voltage divider coupled to said slave latch means for receiving said second voltage signal and for biasing said second voltage singal to a minimum level.

8. The apparatus of claim 4, wherein said slave latch means include:

a first semiconductor switch and a second semiconductor switch and wherein the difference in voltage between the first voltage signal and the second voltage signal is determined by the difference in voltage drop across said first semiconductor switch and said second semiconductor switch.

9. The apparatus of claim 8, wherein said first and second semiconductor switches each include a first circuit path energized when said respective semiconductor switch is on and a second circuit path energized when said respective semiconductor switch is off, and said first circuit paths of said first and second semiconductor switches include means for increasing the voltage drop in said first circuit paths to maintain a desired difference in voltage across said first and second semiconductor switches.

10. The apparatus of claim 4, wherein said lookahead means includes:

first diode means for signal coupling between the first voltage signal of said differential slave latch signal and the master latch signal to pull the first voltage signal of said differential slave latch signal to a level below the second voltage signal of the differential slave latch signal when the master latch signal indicates one level of the first type digital signal; and second diode means for signal coupling between the second voltage signal of the differential slave latch signal and the master latch signal to pull down the second voltage signal of the differential slave latch signal below the level of the first voltage signal of the differential slave latch signal when the master latch signal indicates another level of the first type digital signal.

11. An apparatus for storing a TTL signal and providing a corresponding ECL signal, the apparatus being responsive to a clock signal, comprising:

(a) master latch means for receiving and latching the TTL signal during a portion of the clock signal and for generating a differential master latch signal including a first master voltage signal and a second master voltage signal and having a first master state when the first master voltage signal is higher than the second master voltage signal and having a second master state when the second master voltage signal is higher than the first master voltage signal, the first and second master state of the differential master latch signal corresponding to the TTL signal;

(b) slave latch means, for receiving and latching the differential master latch signal to store the TTL signal and for generating a differential slave latch signal, the differential slave latch signal including a first slave voltage signal and a second slave voltage signal and having a first slave state when the first slave voltage signal is higher than the second slave voltage signal and having a second slave state when the second slave voltage signal is higher than the first slave voltage signal, the first and second slave state of the differential slave latch signal corresponding to the TTL signal;

(c) lookahead means, receiving and responding to the differeintal master latch signal, for switching the state of the differential slave latch signal before said slave latch means completes a latch of the differential master latch signal; and (d) output driver means, receiving and responding to the differential slave latch signal, for supplying the ECL signal.

12. The apparatus df claim 11, wherein said output driver means includes:

a pair of coupled transistors, each receiving a respective one of said first and second slave voltage signals of said differential slave latch signal, one of said pair of coupled transistors being turned on when the differential slave latch signal is in the first slave state and the other of said pair of coupled transistors being turned on when the differntial slave latch signal is in the second slave state;

a current source connected to said pair of coupled transistor for supplying bias current through said pair of coupled transistors; and an emitter follower output driver circuit connected to one of said pair of coupled transistors for providing the ECL signal.

13. The apparatus of claim 11, including:

a first voltage divider means, receiving the first voltage signal for the differential slave latch signal and coupled to said slave latch means, for biasing the first slave voltage signal of the differential slave latch signal to a minimum level; and a second voltage divider means, receiving the second slave voltage signal of the differential slave latch signal and coupled to said slave latch means, for biasing the second slave voltage signal of the differential slave latch signal to a minimum level.

14. The apparatus of claim 11, wherein:

said apparatus is fabricated on a single semiconductor chip.

15. The apparatus of claim 1 wherein:

said lookahead means comprises coupling means for coupling the master latch signal to the slave latch signal, said second type of signal switches before said slave latch means completes a latch of the master latch signal.

16. The apparatus of claim 11, wherein said lookahead means includes:

first diode means for signal coupling between the first slave voltage signal of said differential slave latch signal and the first master voltage signal of the differential master latch signal to pull down the first slave voltage signal of said differential slave latch signal to a level below the second slave voltage signal of the differnetial slave latch signal when the differential master latch signal indicates one level of the TTL signal; and second diode means for signal coupling between the second slave voltage signal of the differential slave latch signal and the second master voltage signal of the differential master latch signal to pull down the second slave voltage signal of the differential slave latch signal below the level of the first slave voltage signal of the differential slave latch signal when the differential master latch signal indicates another level of the TTL signal.

* * * * *